United States Patent
Choi et al.

(10) Patent No.: US 10,892,719 B2
(45) Date of Patent: Jan. 12, 2021

(54) MULTISTAGE POWER AMPLIFIER WITH LINEARITY COMPENSATING FUNCTION

(71) Applicant: SAMSUNG ELECTRO-MECHANICS CO., LTD., Suwon-si (KR)

(72) Inventors: Kyu Jin Choi, Suwon-si (KR); Je Hee Cho, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 103 days.

(21) Appl. No.: 16/284,599

(22) Filed: Feb. 25, 2019

(65) Prior Publication Data

US 2020/0014343 A1    Jan. 9, 2020

(30) Foreign Application Priority Data

Jul. 5, 2018   (KR) .......................... 10-2018-0078186

(51) Int. Cl.
*H03F 3/04* (2006.01)
*H03F 3/21* (2006.01)
(Continued)

(52) U.S. Cl.
CPC ............ *H03F 3/211* (2013.01); *H03F 1/0211* (2013.01); *H03F 1/302* (2013.01); *H03F 3/04* (2013.01);
(Continued)

(58) Field of Classification Search
CPC ................... H03F 3/211; H03F 1/0211; H03F 2203/21131; H03F 2200/102; H03F 1/32; H03F 3/19; H03F 2203/21127; H03F 1/0261; H03F 3/72; H03F 1/08; H03F 3/02; H03F 1/50; H03F 2200/451; H03F 1/0222; H03F 1/26; H03G 3/3042
(Continued)

(56) References Cited

U.S. PATENT DOCUMENTS 6,850,119 B2 * 2/2005 Arnott ....................... H03F 1/52
330/133
10,447,215 B2 * 10/2019 Chen ...................... H03F 3/189
(Continued)

FOREIGN PATENT DOCUMENTS

| JP | 2016-15708 A | 1/2016 |
| KR | 2002-0064768 A | 8/2002 |
| KR | 2003-0090518 A | 11/2003 |

OTHER PUBLICATIONS

Korean Office Action dated Jun. 28, 2019 in corresponding Korean Patent Application No. 10-2018-0078186 (6 pages in English, 5 pages in Korean).
(Continued)

*Primary Examiner* — Khanh V Nguyen
(74) *Attorney, Agent, or Firm* — NSIP Law

(57) ABSTRACT

A multistage power amplifier comprises a first amplification circuit which receives a first bias current; a second amplification circuit which receives a second bias current; an envelope detection circuit which outputs a direct current (DC) detection voltage based on an envelope of an input radio frequency (RF) signal; and a bias compensation circuit which compensates for the first bias current based on the second bias current in response to the DC detection voltage.

17 Claims, 8 Drawing Sheets

(51) Int. Cl.
*H03F 1/02* (2006.01)
*H03F 3/19* (2006.01)
*H03F 1/30* (2006.01)

(52) U.S. Cl.
CPC .......... *H03F 3/19* (2013.01); *H03F 2200/102* (2013.01); *H03F 2200/451* (2013.01); *H03F 2203/21131* (2013.01)

(58) Field of Classification Search
USPC .................. 330/98, 133, 136, 150, 296, 310
See application file for complete search history.

(56) References Cited

U.S. PATENT DOCUMENTS

| 10,547,276 B2* | 1/2020 | Ito ............................ H03F 3/19 |
| 2003/0048135 A1 | 3/2003 | Shinjo et al. |
| 2003/0214359 A1 | 11/2003 | Sasho et al. |

OTHER PUBLICATIONS

Gu, Zeji, et al., "Enhanced Linearity and Efficiency of HBT MMIC Power Amplifiers for WCDMA Applications", *Proceedings of the 40th European Microwave Conference*, Sep. 2010, pp. 1002-1005, Paris, France (4 pages in English).

* cited by examiner

MULTISTAGE POWER AMPLIFIER WITH LINEARITY COMPENSATING FUNCTION

CROSS-REFERENCE TO RELATED APPLICATION

This application claims the benefit under 35 U.S.C. § 119(a) of Korean Patent Application No. 10-2018-0078186 filed on Jul. 5, 2018 in the Korean Intellectual Property Office, the entire disclosure of which is incorporated herein by reference for all purposes.

BACKGROUND

1. Field

The present disclosure relates to a multistage power amplifier with a linearity compensating function.

2. Description of Related Art

Typically, a multistage power amplifier may include a first amplifier and a second amplifier that may be connected to each other in series. The first amplifier and the second amplifier may each have amplification gain, and may amplify input signals using a generally high amplification gain.

The first amplifier may amplify the input signal and output the amplified signal to the second amplifier. The second amplifier may amplify a signal input from the first amplifier and output the amplified signal. The first amplifier and the second amplifier may share a total amplification gain, and the first amplifier may perform an amplification and buffer function.

The first amplifier may be a drive amplifier (DA) and the second amplifier may be a power amplifier (PA).

A typical multistage power amplifier may have a disadvantage that a bias of the first amplifier droops and a bias of the second amplifier rises in a high-power driving region, and thus linearity is lowered.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a multistage power amplifier includes a first amplification circuit configured to receive a first bias current, a second amplification circuit configured to receive a second bias current, an envelope detection circuit configured to output a direct current (DC) detection voltage based on an envelope of an input radio frequency (RF) signal, and a bias compensation circuit configured to compensate for the first bias current based on the second bias current in a high-power driving region in response to the DC detection voltage.

The bias compensation circuit may be configured to generate a compensation current based on a sink current extracted from the second bias current in response to the DC detection voltage, and supply the generated compensation current to a bias terminal of the first amplification circuit.

The multistage power amplifier may further include a first bias circuit configured to supply the first bias current, and a second bias circuit configured to supply the second bias current.

The envelope detection circuit may further be configured to detect an envelope signal from the RF signal and output the DC detection voltage based on the detected envelope signal.

The envelope detection circuit may include a signal extraction circuit configured to extract the envelope signal from the RF signal, a rectifying circuit configured to rectify the extracted envelope signal and output the DC detection voltage, and a filter circuit configured to remove an AC component from the DC detection voltage to stabilize the DC detection voltage.

The envelope detection circuit may further be configured to receive a control voltage from an external source through an input terminal of the rectifying circuit.

The bias compensation circuit may include an amplification circuit which includes an amplification transistor, wherein the amplification circuit may be configured to receive the DC detection voltage as a bias voltage of the amplification transistor, amplify the sink current, and output the compensation current when the DC detection voltage is equal to or greater than a turn-on voltage.

In a general aspect, a multistage power amplifier includes a first bias circuit configured to supply a first bias current, a second bias circuit configured to supply a second bias current, a first amplification circuit configured to receive the first bias current, a second amplification circuit configured to receive the second bias current, an envelope detection circuit configured to output a direct current (DC) detection voltage based on an envelope of an input radio frequency (RF) signal, and a bias compensation circuit configured to compensate for the first bias current based on a sink current branched from the second bias circuit in response to the DC detection voltage.

The second bias circuit may include a bias transistor configured to amplify an internal current to output the second bias current, and the bias compensation circuit may be configured to be branched with the sink current from one of a base of the bias transistor, a collector of the bias transistor, and an emitter of the bias transistor.

The bias compensation circuit may be configured to generate a compensation current based on the sink current in response to the DC detection voltage and supply the generated compensation current to a bias terminal of the first amplification circuit.

The envelope detection circuit may further be configured to detect an envelope signal from the RF signal and output the DC detection voltage based on the detected envelope signal.

The envelope detection circuit may include a signal extraction circuit configured to extract the envelope signal from the RF signal, a rectifying circuit configured to rectify the extracted envelope signal and output the DC detection voltage, and a filter circuit configured to remove an AC component from the DC detection voltage to stabilize the DC detection voltage.

The envelope detection circuit may further be configured to receive a control voltage from an external source through an input terminal of the rectifying circuit.

The bias compensation circuit may include an amplification circuit which includes an amplification transistor, wherein the amplification circuit may be configured to receive the DC detection voltage as a bias voltage of the amplification transistor, amplify the sink current, and output the compensation current when the DC detection voltage is equal to or greater than a turn-on voltage.

In a general aspect, a multistage power amplifier includes a first amplification circuit configured to receive a first bias current, a second amplification circuit configured to receive a second bias current, an envelope detection circuit configured to output a direct current (DC) detection voltage based on an envelope of an input radio frequency (RF) signal, and a bias compensation circuit configured to compensate for the first bias current based on the second bias current in response to the DC detection voltage.

The bias compensation circuit may be configured to compensate for the first bias current based on the second bias current in a high-power driving region.

The multistage power amplifier may further include a first bias circuit configured to supply the first bias current, and a second bias circuit configured to supply the second bias current.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
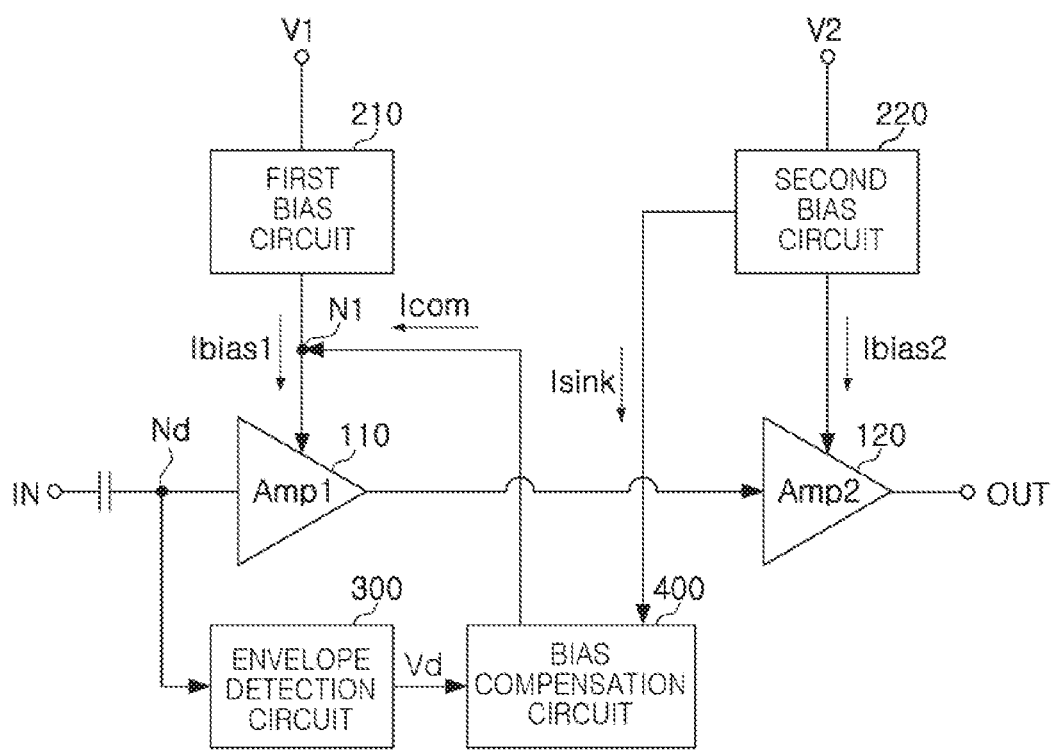
FIG. 1 is a diagram illustrating an example of a multistage power amplifier.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
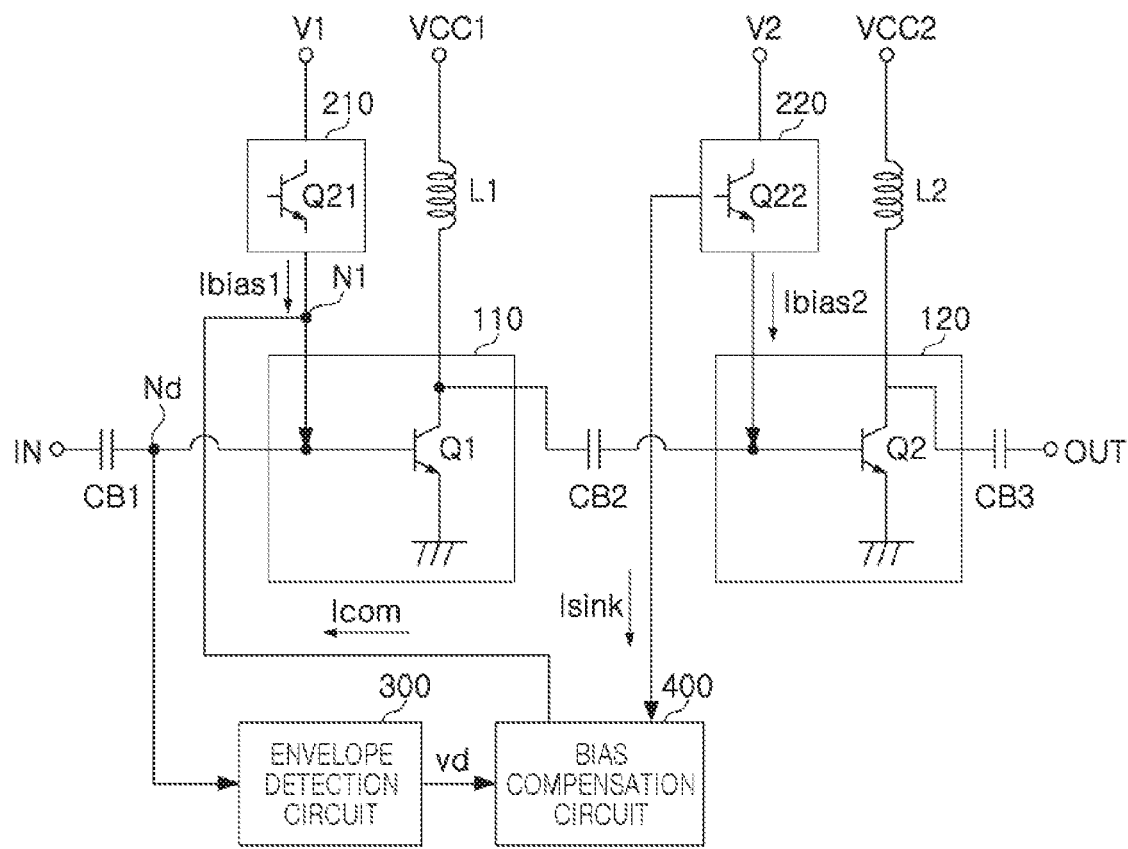
FIG. 2 is an example of a circuit diagram of the multistage power amplifier.

FIG. 1 is a diagram illustrating an example of a multistage power amplifier and FIG. 2 is a circuit diagram of the example multistage power amplifier.

Referring to FIGS. 1 and 2, a multistage power amplifier according to an example may include a first bias circuit 210, a second bias circuit 220, a first amplification circuit (Amp1) 110, a second amplification circuit (Amp2) 120, an envelope detection circuit 300, and a bias compensation circuit 400.

When a bias circuit without compensation is used for each of the first amplification circuit 110 and the second amplification circuit 120 according to an example, power transistor bias points of power transistors included in the first amplification circuit 110 and the second amplification circuit 120, respectively, at a small signal and a large signal may be different from each other. The reason is because magnitude of the signal swing input to the power transistor may cause a difference in a nonlinear operation of the bias circuit.

In general, as input power is increased, the bias point increases while magnitude of the additional DC component generated by secondary nonlinear characteristics of the bias circuit increases, and on the contrary, when the input power is low, since the magnitude of the additional DC component by nonlinearity of the bias circuit is small, the bias point of the power transistor droops.

In a multi stage amplifier, an amplitude distortion (e.g., AM-AM distortion) may be determined according to a change aspect of the bias point that varies by amplitude of an input signal of each stage, which is very directly related to the linearity. Therefore, according to the present disclosure, the droop and rising of the bias by non-linearity may be compensated.

Referring to FIGS. 1 and 2, the first amplification circuit 110 may be driven with relatively small input power as compared to the second amplification circuit 120. In the example in which the bias compensation circuit 400 is not applied as described above, as the amplitude of the input signal increases, the bias point of the first amplification circuit 110 may droop and the bias point of the second amplification circuit 120 may rise.

In the example in which the bias compensation circuit 400 according to the present disclosure is applied, when the second amplification circuit 120 is driven with a large input and the bias point of the second amplification circuit 120 rises, some of the bias current of the second amplification circuit 120 may be sunk and some of the sunk current may be additionally supplied to the first bias current of the first amplification circuit 110, thereby simultaneously mitigating the bias point of the second amplification circuit 120 rising in a high power region and the bias point of the first amplification circuit 110 drooping therein. This will hereinafter be described.

The first bias circuit 210 may supply a first bias current Ibias1 using an internal current generated based on a supplied first voltage V1.

The second bias circuit 220 may supply a second bias current Ibias2 using an internal current generated based on a supplied second voltage V2.

The first amplification circuit 110 may be supplied with the first bias current Ibias1, and the first amplification circuit 110 may amplify an input radio frequency signal, and output the amplified radio frequency signal to the second amplification circuit 120.

The second amplification circuit 120 may be supplied with the second bias current Ibias2 and amplify the radio frequency signal amplified by the first amplification circuit 110, and output the amplified radio frequency signal to an output terminal OUT.

The envelope detection circuit 300 may output a direct current (DC) detection voltage Vd based on an envelope of the radio frequency signal input through an input terminal IN and a capacitor.

The bias compensation circuit 400 may compensate for the first bias current Ibias1 based on a sink current Isink branched from the second bias circuit 220 in response to the DC detection voltage Vd.

In addition, the bias compensation circuit 400 may branch the sink current Isink from a second bias current Ibias2 to compensate for the second bias current Ibias2.

As an example, the envelope detection circuit 300 may detect the envelope signal from the radio frequency signal and output the DC detection voltage Vd based on the envelope signal. This will be described with reference to FIG. 9.

The bias compensation circuit 400 may generate a compensation current Icom using the sink current Isink in response to the DC detection voltage Vd, and supply the compensation current Icom to a first bias terminal N1 of the first amplification circuit 110.

Accordingly, at the first bias terminal N1, the compensation current Icom may be added to the first bias current Ibias1 generated from the first bias circuit 210 to compensate for the droop of the first bias current Ibias1.

In the respective drawings in the present disclosure, an unnecessary overlapping description for components denoted by the same reference numerals and having the same functions will be omitted, and contents different from each other will be described in the respective drawings.

Referring to FIG. 2, the first amplification circuit 110 may include a first amplification transistor Q1 having a base which is supplied with the first bias current Ibias1, and a collector which is supplied with a first operation voltage Vcc1 through a first inductor L1. The first amplification circuit 110 may amplify the radio frequency signal input through the input terminal IN and the capacitor CB1, and output the amplified radio frequency signal to the second amplification circuit 120 through the capacitor CB2.

The second amplification circuit 120 may include a second amplification transistor Q2 having a base which is supplied with the second bias current Ibias2, and a collector which is supplied with a second operation voltage Vcc2 through a second inductor L2. The second amplification circuit 120 may amplifying the radio frequency signal input from the first amplification circuit 110, and output the amplified radio frequency signal to the output terminal OUT through the capacitor CB3.

The first bias circuit 210 may include a first bias transistor Q21 which amplifies the internal current I1 generated based on the first voltage V1, and outputs the first bias current Ibias1.

The second bias circuit 220 may include a second bias transistor Q22 which amplifies the internal current I2 generated based on the second voltage V2, and outputs the second bias current Ibias2.

In FIG. 2, CB1, CB2, and CB3 may be DC blocking capacitors that block the DC signal (voltage or current) and pass the AC signal.

Figure 3:
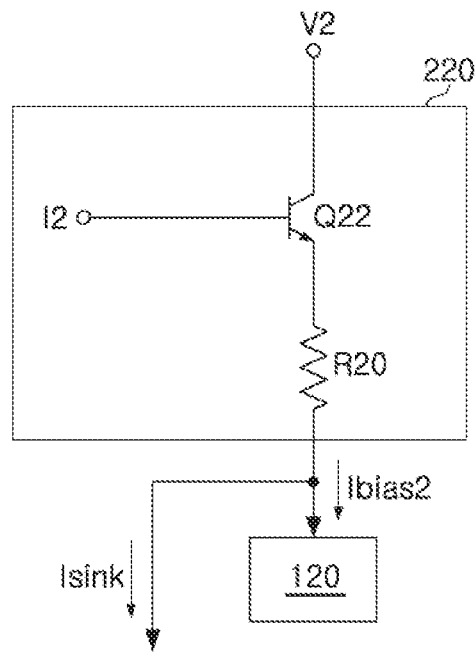
FIG. 3 is a diagram illustrating an example of a branch of a sink current of FIG. 2.

FIG. 3 is a diagram illustrating a branch of a sink current of FIG. 2.

Referring to FIG. 3, the bias compensation circuit 400 may compensate for the first bias current Ibias1 using the sink current Isink branched from the second bias current Ibias2.

As an example, referring to FIGS. 2 and 3, the bias compensation circuit 400 may generate the compensation current Icom using the sink current Isink extracted from the second bias current Ibias2 in response to the DC detection voltage Vd and supply the compensation current Icom to the first bias terminal N1 of the first amplification circuit 110.

In addition, the bias compensation circuit 400 may be branched with the sink current Isink from one of a base, a collector, and an emitter of the bias transistor Q22, unlike FIG. 3. This will be described with reference to FIGS. 4, 5, and 6.

Figure 4:
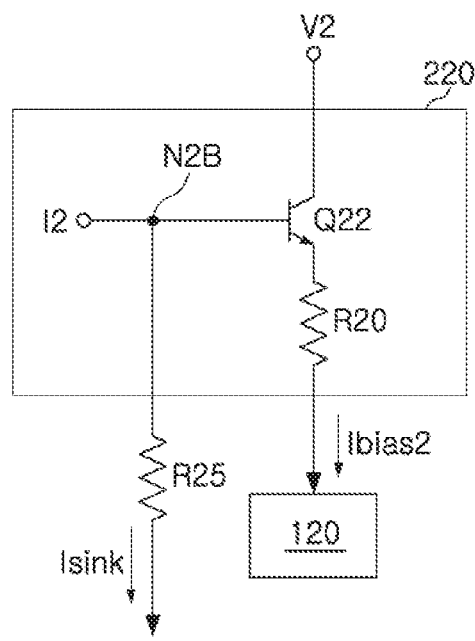
FIG. 4 is a diagram illustrating an example of a branch of a sink current of FIG. 2.
Figure 5:
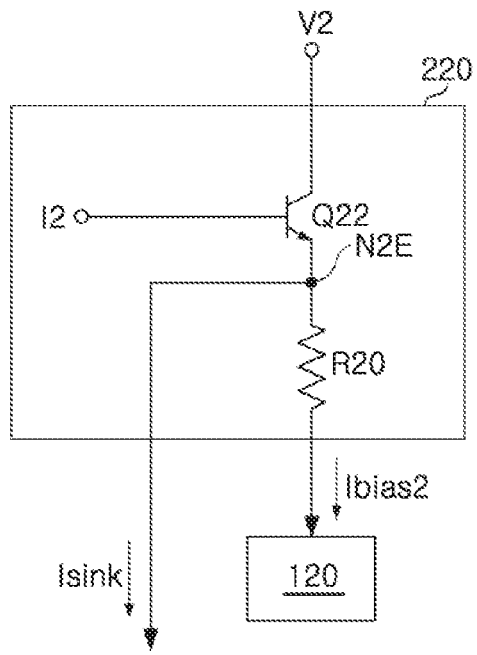
FIG. 5 is a diagram illustrating an example of a branch of a sink current of FIG. 2.
Figure 6:
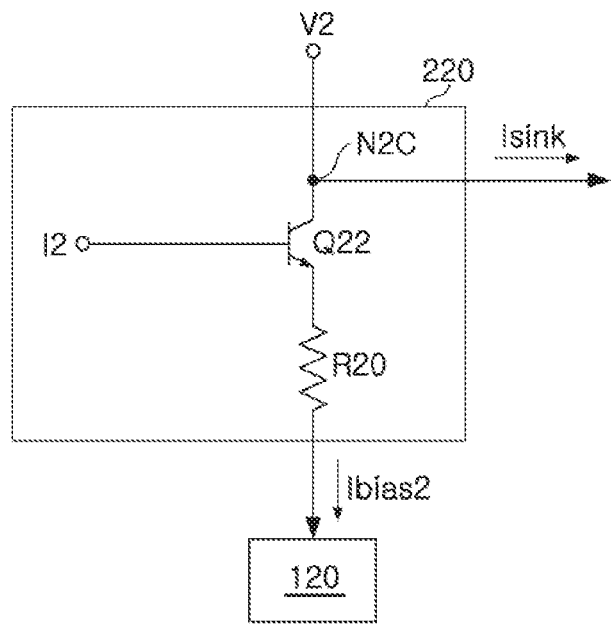
FIG. 6 is a diagram illustrating an example of a branch of a sink current of FIG. 2.

FIG. 4 is a diagram illustrating an example of a branch of a sink current of FIG. 2, FIG. 5 is a diagram illustrating an example of a branch of a sink current of FIG. 2, and FIG. 6 is a diagram illustrating an example of a branch of a sink current of FIG. 2.

Referring to FIG. 4, as an example, the sink current Isink may be branched from the base of the bias transistor Q22.

Referring to FIG. 5, as an example, the sink current Isink may be branched from the emitter of the bias transistor Q22.

Referring to FIG. 6, as an example, the sink current Isink may be branched from the collector of the bias transistor Q22.

Referring to FIGS. 4 through 6, the bias transistor Q22 may amplify the internal current I2 input through the base thereof and output the second bias current Ibias2 through the emitter thereof. The second bias circuit 220 may include a ballast resistor R20 connected to the emitter of the bias transistor Q22 to adjust magnitude of the second bias current Ibias2.

Figure 7:
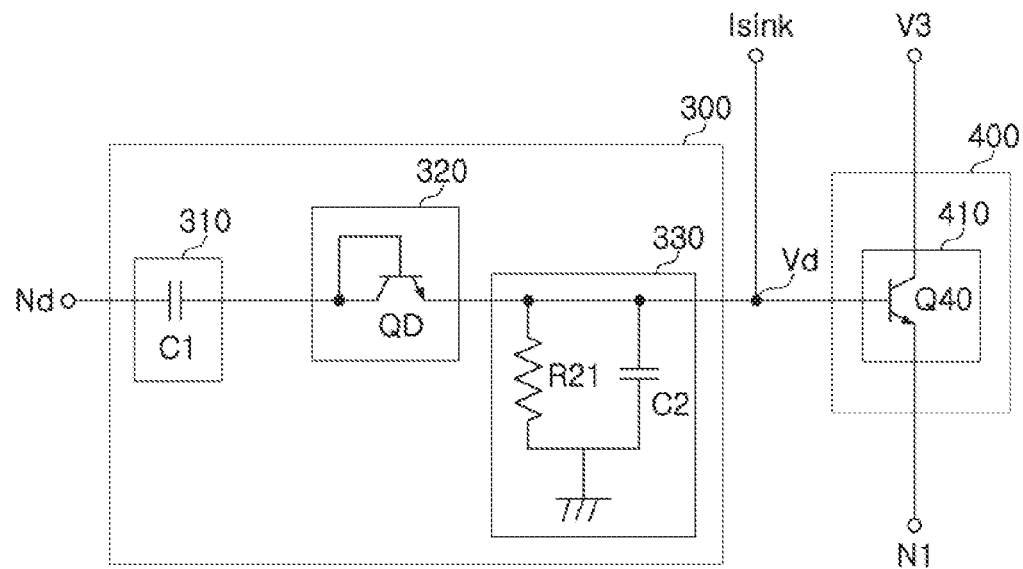
FIG. 7 is a diagram illustrating an example of an envelope detection circuit and a bias compensation circuit.
Figure 8:
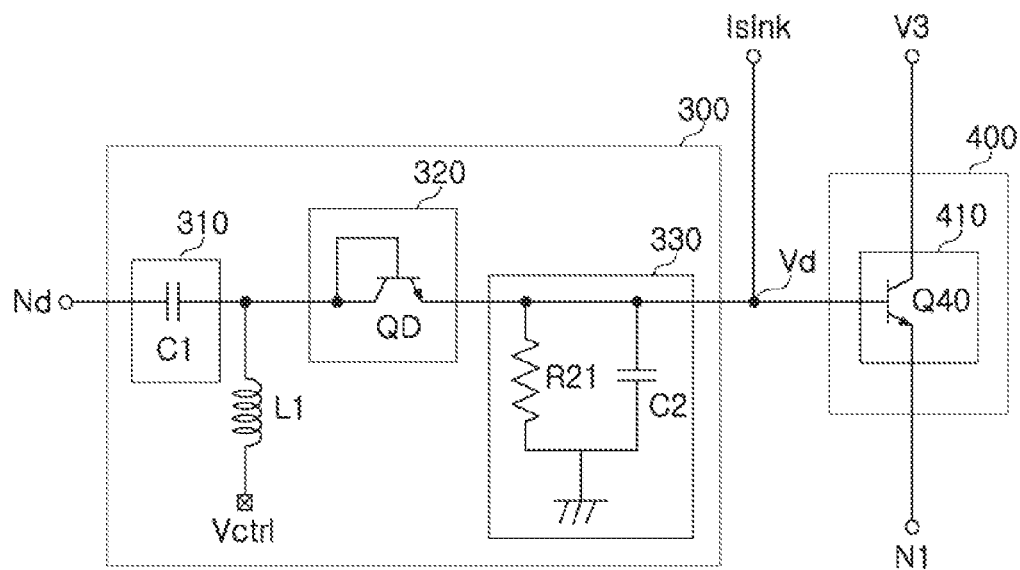
FIG. 8 is a diagram illustrating an example of an envelope detection circuit and a bias compensation circuit.

FIG. 7 is a diagram illustrating an example of an envelope detection circuit 300 and a bias compensation circuit 400 according to an example, and FIG. 8 is a diagram illustrating an example of an envelope detection circuit 300 and a bias compensation circuit 400 according to an example.

Referring to FIGS. 7 and 8, the envelope detection circuit 300 may include a signal extraction circuit 310, a rectifying circuit 320, and a filter circuit 330.

The signal extraction circuit 310 may be connected to a detection node Nd between the signal input terminal IN and the input terminal of the first amplification circuit 110 to extract the envelope signal of the radio frequency signal. As an example, the signal extraction circuit 310 may include a capacitor C1.

The rectifying circuit 320 may rectify the envelope signal input through the signal extraction circuit 310 and output the DC detection voltage Vd. As an example, the rectifying circuit 320 may include at least one rectifying element QD, and the rectifying element QD may be a rectifying diode, or a diode-connected transistor.

The filter circuit 330 may remove an AC component from the DC detection voltage Vd to stabilize the DC detection voltage Vd. As an example, the filter circuit 330 may include a capacitor C2 connected between an output terminal of the rectifying circuit 320 and a ground, and a resistor R21 connected in parallel with the capacitor C2.

The bias compensation circuit 400 may include an amplification circuit 410. The amplification circuit 410 may include an amplification transistor Q40, may be supplied with the DC detection voltage Vd as a bias voltage of the amplification transistor Q40, and may amplify the sink current Isink, and output the compensation current Icom when the DC detection voltage Vd is equal to, or greater than, a turn-on voltage.

In other words, the bias compensation circuit 400 may be turned off in a low-power region, may be turned on only in a high-power region, and may be a switchable amplification circuit that amplifies the sink current Isink branched from the second bias circuit 210 in a turned-on state.

In addition, the output DC detection voltage Vd may vary depending on the power magnitude of the radio frequency signal input to the envelope detection circuit 300. As an example, when a small power is input to the envelope detection circuit 300, a small DC detection voltage Vd may be detected, such that the amplification transistor Q40 of the bias compensation circuit 400 may be turned off. When the power magnitude of the radio frequency signal is gradually increased to generate the DC detection voltage Vd of a specific critical point or more, the amplification transistor Q40 of the bias compensation circuit 400 may be turned on. In addition, only during an operation in which the amplification transistor Q40 of the bias compensation circuit 400 is turned on, some current may be sunk from the second bias circuit of the second amplification circuit, may be amplified, and may then be added to the first bias current of the first amplification circuit to thereby compensate for the first bias current.

Referring to FIG. 8, the envelope detection circuit 300 may receive a control voltage Vctrl from an external source through an input terminal of the rectifying circuit 320.

When the voltage magnitude of the control voltage Vctrl is adjusted, the turn-on of the amplification transistor Q40 of the bias compensation circuit 400 may be controlled.

In detail, in order to adjust a range of the DC detection voltage Vd provided from an output terminal of the envelope detection circuit 300, the control voltage Vctrl may be supplied to an anode terminal of the rectifying element QD. Depending on the magnitude of the control voltage Vctrl, the magnitude of an input voltage capable of turning on the amplification transistor Q40 may be controlled.

As an example, when a high control voltage Vctrl is applied, the rectifying element QD and the amplification transistor Q40 may be turned on even at a relatively small input power. On the contrary, in a case in which a low control voltage Vctrl is applied, since a base-emitter junction of the amplification transistor Q40 may be turned off even when the rectifying element QD is turned on, the amplification transistor Q40 may not be driven.

For example, in an example in which the emitter of the amplification transistor Q40 has a voltage of 1.2V, in order for the amplification transistor Q40 to be turned on, a base voltage of about 2.4V or more which is greater than the turn-on voltage (e.g., 1.2V) rather than the emitter voltage of 1.2V should be applied.

Therefore, in order for the base voltage of the amplification transistor Q40 to be equal to or greater than 2.4 V, considering the turn-on voltage of the rectifying element DT4 of 1.2V and the swing of the signal additionally input through the capacitor C1, an approximate control voltage VC should be about 3.1V to 3.4V.

In an example in which the above-mentioned base voltage is applied, in order for the turn-on voltage of the base-emitter junction to be equal to or greater than 1.2V, and for the base voltage of the amplification transistor Q40 to be equal to or greater than 2.4V, considering the turn-on voltage of the rectifying element QD of 1.2V and the swing of the signal additionally input through the signal extraction circuit 310, an approximate control voltage Vctrl should be about 3.1V to 3.4V.

As an example, when the conditions of the control voltage Vctrl and the input power at which the amplification transistor Q40 may operate are satisfied, the amplification transistor Q40 may branch a signal (see FIG. 4) of the current input to the base of the second bias transistor Q22 of the second bias circuit 220, and the branched sink current Isink may be amplified and added to the first bias current Ibias1 at the first bias terminal N1 of the first bias circuit 210, such that the first bias current Ibias1 may be compensated and supplied to the first amplification circuit 110.

In order to adjust an amount of the sink current Isink, a resistor (R25 in FIG. 4) may be added to a sink path.

Figure 9:
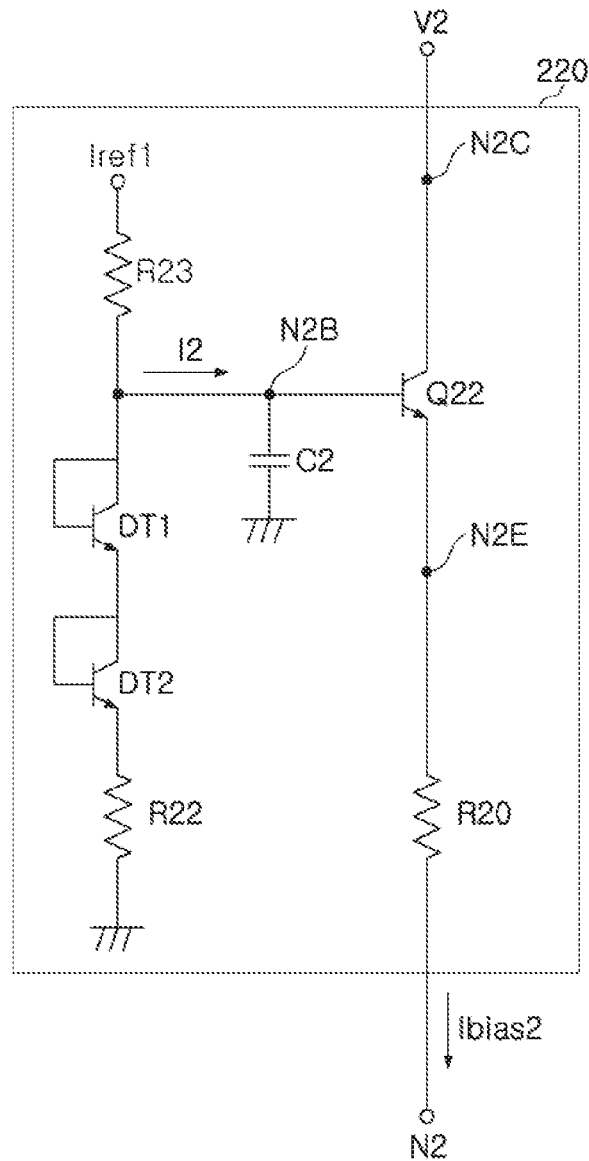
FIG. 9 is a diagram illustrating an example of a second bias circuit.

FIG. 9 is a diagram illustrating an example of a second bias circuit.

Referring to FIG. 9, for example, the second bias circuit 220 may include a first resistor R23, first and second diode-connected transistors DT1 and DT2, a second resistor R22, a capacitor C2, the bias transistor Q22, and a ballast resistor R20.

The first resistor R23, the first and second diode-connected transistors DT1 and DT2, and the second resistor R22 may be connected to each other in series between a reference current Iref1 terminal and a ground. The bias transistor Q22 and the ballast resistor R20 may be connected in series between a second voltage V2 terminal and a second bias node N2 connected to the second amplification circuit 120. The capacitor C2 may be connected between a base of the bias transistor Q22 and a ground.

Referring to FIG. 9, the bias compensation circuit 400 may be branched with the sink current Isink from one of a base node N2B, a collector node N2C, and an emitter node N2E of the bias transistor Q22.

Figure 10:
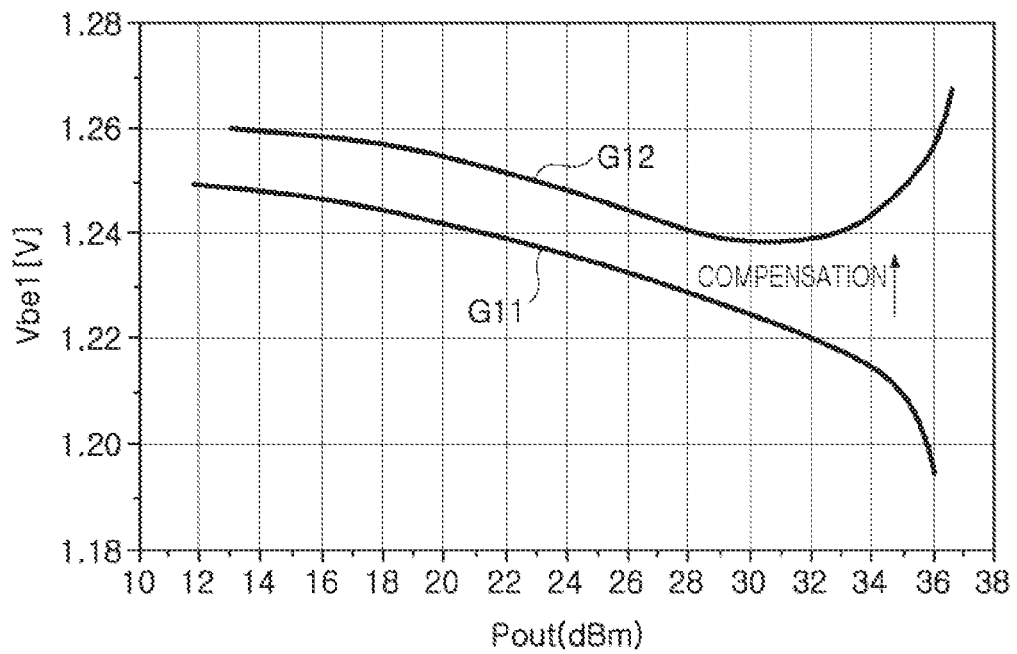
FIG. 10 illustrates an example of a graph of Vbe-output power of a first amplification circuit.

FIG. 10 is a graph of Vbe-output power of a first amplification circuit 110 according to an example.

The graph of FIG. 10 is a graph representing a result obtained by simulating a base-emitter voltage Vbe of the first amplification circuit 110 and output power while increasing input power.

Graph G11 of FIG. 10 is a Vbe-output power graph of the first amplification circuit 110 for an example where the bias compensation circuit 400 is not applied, and graph G12 is a Vb-output power graph of the first amplification circuit 110 for an example where the bias compensation circuit 400 is applied.

Referring to graphs G11 and G12 of FIG. 10, it may be seen that a droop phenomenon of a base-emitter voltage Vbe of the first amplification circuit 110 is improved in the example where the bias compensation circuit 400 according to the present disclosure is applied as compared to the example where the bias compensation circuit 400 is not applied, and the base-emitter voltage Vbe rises again from an output voltage of about 30 dBm to further improve the voltage droop phenomenon.

Figure 11:
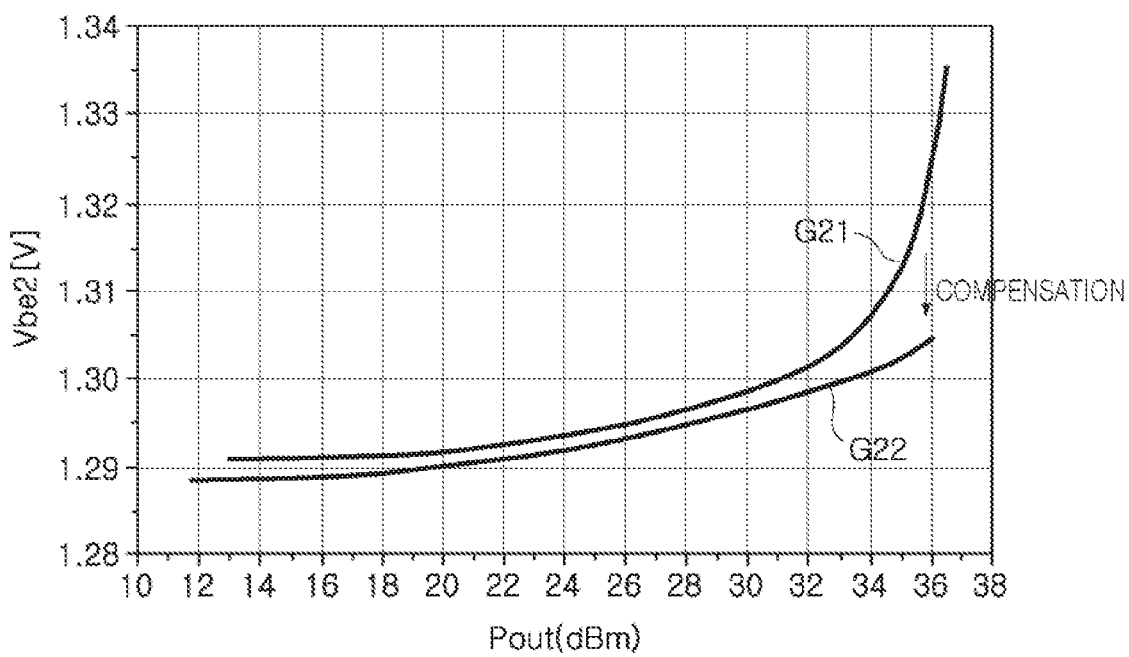
FIG. 11 illustrates an example of a graph of Vbe-output power of a second amplification circuit.

FIG. 11 is a graph of Vbe-output power of a second amplification circuit 120 according to an example.

The graph of FIG. 11 is a graph representing a result obtained by simulating a base-emitter voltage Vbe of the second amplification circuit 120 and output power while increasing input power.

Graph G21 of FIG. 11 is a Vbe-output power graph of the second amplification circuit 120 for an example where the bias compensation circuit 400 is not applied, and graph G22 is a Vb-output power graph of the second amplification circuit 120 for an example where the bias compensation circuit 400 is applied.

Referring to graphs G11 and G12 of FIG. 10, it may be seen that a voltage rising phenomenon of the base-emitter voltage Vbe of the second amplification circuit 120 is further improved from an outer voltage of about 30 dBm in the example (see graph G12) to which the bias compensation circuit 400 according to the present disclosure is applied as compared to the example (see graph G11) to which the bias compensation circuit 400 is not applied.

Referring to FIGS. 10 and 11, it may be seen that even in a region in which the input power is increased, the degree of reduction and rising of the base-emitter voltage Vbe of the first amplification circuit 110 and the second amplification circuit 120 may be mitigated to improve an AM-AM distortion.

Figure 12:
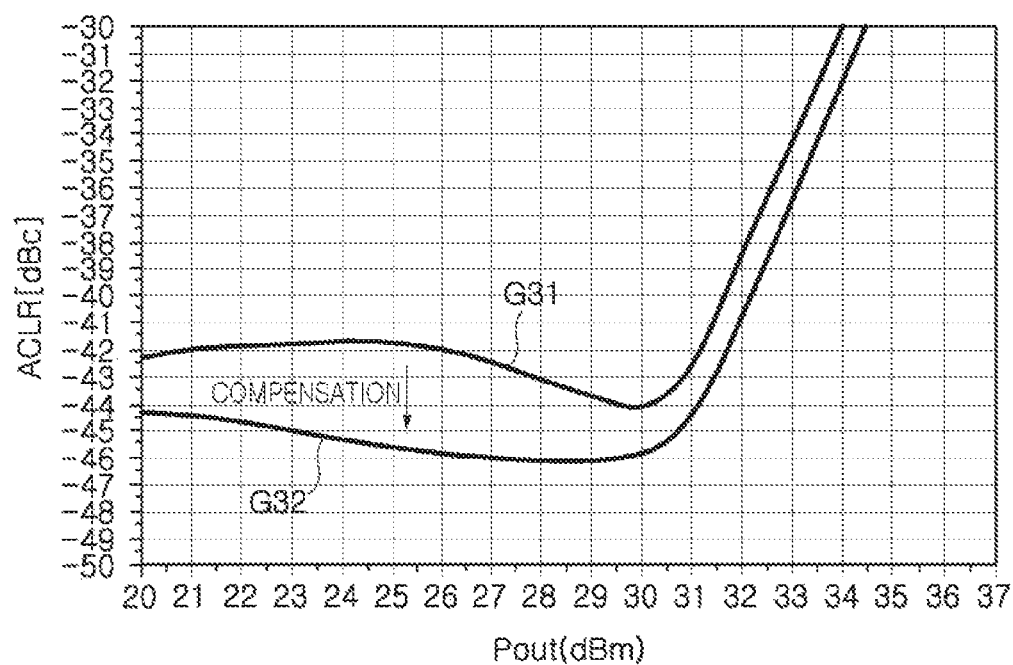
FIG. 12 illustrates an example of a graph of ACLR-output power.

FIG. 12 is an example of a graph of ACLR-output power.

The graph of FIG. 12 is a graph of a result obtained by simulating an adjacent channel leakage ratio (ACLR) while increasing input power.

Graph G31 of FIG. 12 is an ACLR graph for the example where the bias compensation circuit 400 is not applied, and graph G32 is an ACLR graph for the example where the bias compensation circuit 400 is applied.

Referring to graphs G31 and G32 of FIG. 12, it may be seen that the first amplification circuit 110 and the second amplification circuit 120 show the shape of droop and rising of each of the AM-AM distortion curves due to a difference in swing size of the input signal, and in the example where the bias compensation circuit 400 is applied, a change in the AM-AM distortion curve in an overall region shown in the graph is mitigated to thereby improve the ACLR, which is a linearity index.

As set forth above, according to the various examples, by compensating for the first bias and the second bias in the high-power driving region, the linearity of the first bias and the second bias may be improved and amplitude distortion (e.g., AM-AM distortion) of the multistage power amplifier may be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multistage power amplifier comprising:
    a first amplification circuit configured to receive a first bias current;
    a second amplification circuit configured to receive a second bias current;
    an envelope detection circuit configured to output a direct current (DC) detection voltage based on an envelope of an input radio frequency (RF) signal; and
    a bias compensation circuit configured to compensate for the first bias current based on the second bias current in a high-power driving region in response to the DC detection voltage.

2. The multistage power amplifier of claim 1, wherein the bias compensation circuit is configured to generate a compensation current based on a sink current extracted from the second bias current in response to the DC detection voltage, and supply the generated compensation current to a bias terminal of the first amplification circuit.

3. The multistage power amplifier of claim 1, further comprising:
a first bias circuit configured to supply the first bias current; and
a second bias circuit configured to supply the second bias current.

4. The multistage power amplifier of claim 2, wherein the envelope detection circuit is further configured to detect an envelope signal from the RF signal and output the DC detection voltage based on the detected envelope signal.

5. The multistage power amplifier of claim 4, wherein the envelope detection circuit comprises:
a signal extraction circuit configured to extract the envelope signal from the RF signal;
a rectifying circuit configured to rectify the extracted envelope signal and output the DC detection voltage; and
a filter circuit configured to remove an AC component from the DC detection voltage to stabilize the DC detection voltage.

6. The multistage power amplifier of claim 5, wherein the envelope detection circuit is further configured to receive a control voltage from an external source through an input terminal of the rectifying circuit.

7. The multistage power amplifier of claim 4, wherein the bias compensation circuit comprises an amplification circuit which includes an amplification transistor,
wherein the amplification circuit is configured to receive the DC detection voltage as a bias voltage of the amplification transistor, amplify the sink current, and output the compensation current when the DC detection voltage is equal to or greater than a turn-on voltage.

8. A multistage power amplifier comprising:
a first bias circuit configured to supply a first bias current;
a second bias circuit configured to supply a second bias current;
a first amplification circuit configured to receive the first bias current;
a second amplification circuit configured to receive the second bias current;
an envelope detection circuit configured to output a direct current (DC) detection voltage based on an envelope of an input radio frequency (RF) signal; and
a bias compensation circuit configured to compensate for the first bias current based on a sink current branched from the second bias circuit in response to the DC detection voltage.

9. The multistage power amplifier of claim 8, wherein the second bias circuit comprises a bias transistor configured to amplify an internal current to output the second bias current, and
the bias compensation circuit is configured to be branched with the sink current from one of a base of the bias transistor, a collector of the bias transistor, and an emitter of the bias transistor.

10. The multistage power amplifier of claim 9, wherein the bias compensation circuit is configured to generate a compensation current based on the sink current in response to the DC detection voltage and supply the generated compensation current to a bias terminal of the first amplification circuit.

11. The multistage power amplifier of claim 10, wherein the envelope detection circuit is further configured to detect an envelope signal from the RF signal and output the DC detection voltage based on the detected envelope signal.

12. The multistage power amplifier of claim 11, wherein the envelope detection circuit comprises:
a signal extraction circuit configured to extract the envelope signal from the RF signal;
a rectifying circuit configured to rectify the extracted envelope signal and output the DC detection voltage; and
a filter circuit configured to remove an AC component from the DC detection voltage to stabilize the DC detection voltage.

13. The multistage power amplifier of claim 12, wherein the envelope detection circuit is further configured to receive a control voltage from an external source through an input terminal of the rectifying circuit.

14. The multistage power amplifier of claim 11, wherein the bias compensation circuit comprises an amplification circuit which includes an amplification transistor,
wherein the amplification circuit is configured to receive the DC detection voltage as a bias voltage of the amplification transistor, amplify the sink current, and output the compensation current when the DC detection voltage is equal to or greater than a turn-on voltage.

15. A multistage power amplifier comprising:
a first amplification circuit configured to receive a first bias current;
a second amplification circuit configured to receive a second bias current;
an envelope detection circuit configured to output a direct current (DC) detection voltage based on an envelope of an input radio frequency (RF) signal; and
a bias compensation circuit configured to compensate for the first bias current based on the second bias current in response to the DC detection voltage.

16. The multistage power amplifier of claim 15, wherein the bias compensation circuit is configured to compensate for the first bias current based on the second bias current in a high-power driving region.

17. The multistage power amplifier of claim 15, further comprising:
a first bias circuit configured to supply the first bias current; and
a second bias circuit configured to supply the second bias current.

* * * * *